United States Patent
Luoh et al.

(10) Patent No.: US 7,938,972 B2
(45) Date of Patent: May 10, 2011

(54) FABRICATION METHOD OF ELECTRONIC DEVICE

(75) Inventors: Tuung Luoh, Taipei (TW); Ling-Wuu Yang, Hsinchu (TW); Kuang-Chao Chen, Hsinchu (TW)

(73) Assignee: Macronix International Co., Ltd. (TW)

( * ) Notice: Subject to any disclaimer, the term of this patent is extended or adjusted under 35 U.S.C. 154(b) by 770 days.

(21) Appl. No.: 11/976,486

(22) Filed: Oct. 25, 2007

(65) Prior Publication Data

US 2008/0099427 A1  May 1, 2008

(30) Foreign Application Priority Data

Oct. 25, 2006  (TW) .............................. 95139397 A

(51) Int. Cl.
*H01B 13/00* (2006.01)
*B44C 1/22* (2006.01)

(52) U.S. Cl. ................ 216/13; 216/17; 216/41; 216/58; 216/67; 438/689; 438/706; 438/710

(58) Field of Classification Search .................. 216/13, 216/17, 41, 58, 67; 438/689, 706, 710
See application file for complete search history.

(56) References Cited

U.S. PATENT DOCUMENTS

| | | | |
|---|---|---|---|
| 2003/0216026 A1* | 11/2003 | Mukherjee-Roy et al. ... | 438/622 |
| 2004/0198065 A1* | 10/2004 | Lee et al. ...................... | 438/725 |
| 2004/0245644 A1* | 12/2004 | Yin et al. ...................... | 257/758 |
| 2005/0136675 A1 | 6/2005 | Sandhu et al. | |

FOREIGN PATENT DOCUMENTS

EP  1 154 468 A2  11/2001
TW  430878  4/2001

\* cited by examiner

*Primary Examiner* — Shamim Ahmed

(74) *Attorney, Agent, or Firm* — Bacon & Thomas, PLLC

(57) ABSTRACT

A fabrication method of an electronic device is provided. First, a substrate is provided. Then, a patterned amorphous carbon (α-C) layer is formed on the substrate and exposes part of the substrate. Next, a first α-C layer covering the patterned α-C layer and part of the substrate is formed. Then, part of the substrate and part of the first α-C layer covering part of the substrate are removed, so as to form a patterned substrate and a second α-C layer.

24 Claims, 3 Drawing Sheets

FABRICATION METHOD OF ELECTRONIC DEVICE

This application claims the benefit of Taiwan application Serial No. 95139397, filed Oct. 25, 2006, the subject matter of which is incorporated herein by reference.

BACKGROUND OF THE INVENTION

1. Field of the Invention

The invention relates in general to a fabrication method of an electronic device, and more particularly to a fabrication method of an electronic device using an amorphous carbon ($\alpha$-C) layer to adjust the pattern pitch of a hard mask.

2. Description of the Related Art

As integrated circuit devices become smaller and smaller, all the steps of a general semiconductor manufacturing process need to be adjusted to reach the required integration. For example, the thickness of the photoresist layer is reduced to increase the resolution of the pattern in the microlithography process. Or, a photolithographic machine with 193 um deep ultraviolet (DUV) is used to achieve the resolution of 50 nm above. However, the substrate can not be well shielded by the thinner photoresist layer when the etch selectivity is not increased relatively. Moreover, when a photolithographic machine with 248 um DUV is used to replace the photolithographic machine with 193 um DUV, the cost is increased and the reflectivity at the interfaces of films is increased. As a result, the transfer quality of the photoresist pattern is lowered.

Furthermore, a spacer and a hard mask (generally made of an oxide layer, such as silicon dioxide ($SiO_2$) or silicon nitride (SiN)) formed between the photoresist layer and the substrate are used for improving the pattern transfer accuracy and the line-width. However, the conventional hard mask can not be used in some materials. In the process of removing the photoresist layer and the mask, several etching steps with different selectivity need to be performed. Therefore, the manufacturing time is increased, and the process becomes more complicated. Moreover, the hard mask may result in pollution in the following process after removed.

SUMMARY OF THE INVENTION

The invention is directed to a fabrication method of an electronic device. An amorphous carbon layer is deposited for adjusting the pattern pitch of a hard mask. Accordingly, the selectivity is high, and the reflectivity is low. Also, a thinner photoresist layer and a photolithographic machine with 248 um DUV are able to be used to perform the microlithography process. The resolution and the pattern pitch are the same as those obtained through a photolithographic machine with 193 um DUV. Furthermore, the photoresist layer and the mask are easily removed. The manufacturing time and cost are reduced.

According to the present invention, a fabrication method of an electronic device is provided. First, a substrate is provided. Next, a patterned amorphous carbon ($\alpha$-C) layer is formed on the substrate. The patterned $\alpha$-C layer exposes part of the substrate. Then, a first $\alpha$-C layer covering the patterned $\alpha$-C layer and part of the substrate is formed. Afterward, part of the substrate and part of the first $\alpha$-C layer covering part of the substrate are removed for forming a patterned substrate and a second $\alpha$-C layer.

According to the present invention, a fabrication method of a contact hole is provided. First, a patterned amorphous carbon ($\alpha$-C) layer is formed on a substrate by etching an $\alpha$-C layer covering the substrate through a plasma $O_2$ etching process. The patterned $\alpha$-C layer exposes part of the substrate. Then, a first $\alpha$-C layer covering the patterned $\alpha$-C layer and part of the substrate is formed. Afterward, part of the substrate and part of the first $\alpha$-C layer are removed through a plasma $O_2$ etching process.

The invention will become more apparent from the following detailed description of the preferred but non-limiting embodiments. The following description is made with reference to the accompanying drawings.

DETAILED DESCRIPTION OF THE INVENTION

Figure 1:
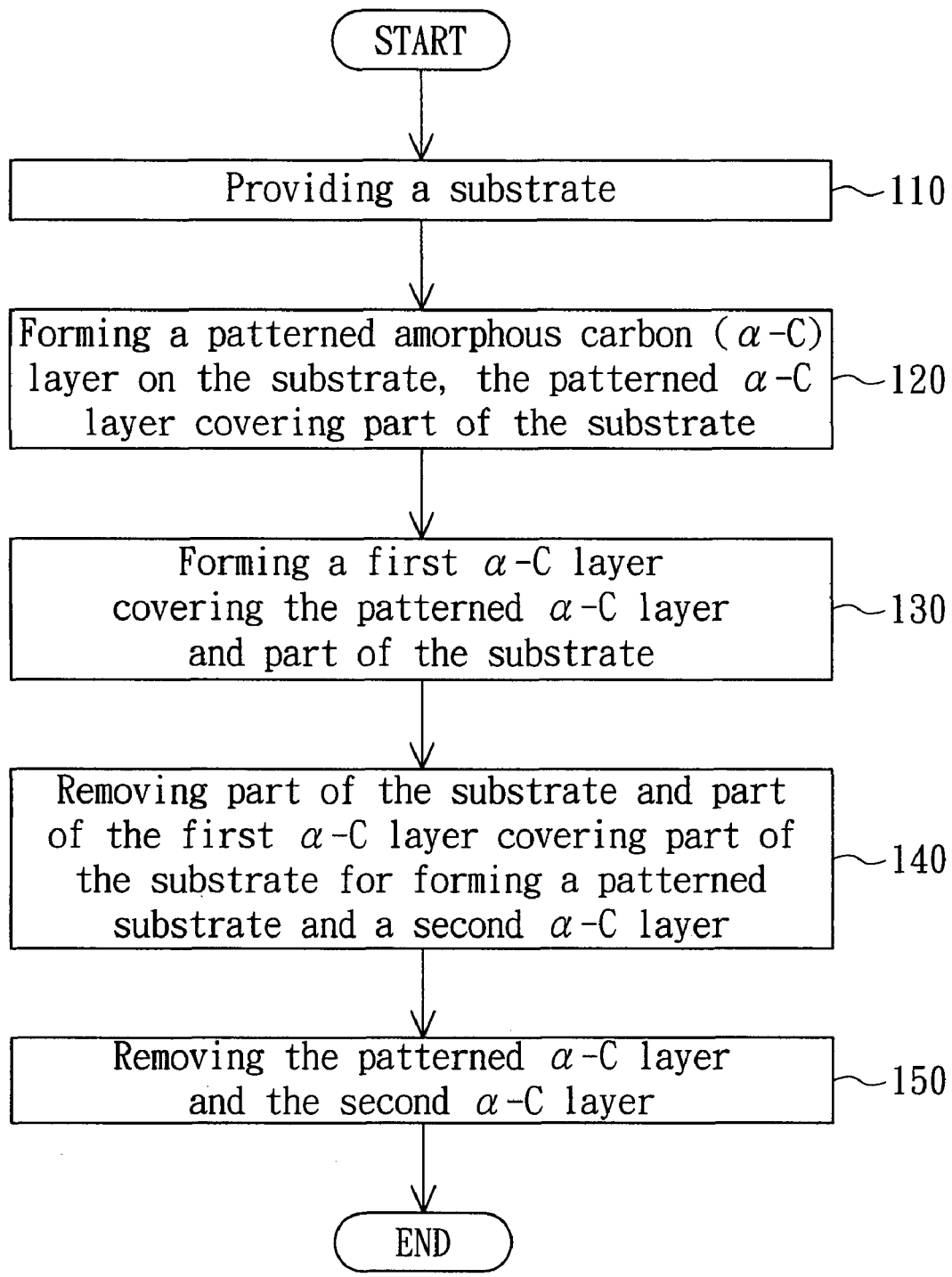
FIG. 1 is a flow chart of a fabrication method of an electronic device according to a preferred embodiment of the present invention.

FIG. 1 is a flow chart of a fabrication method of an electronic device according to a preferred embodiment of the present invention. Please refer to FIG. 1. First, in a step 110, a substrate is provided. Next, in a step 120, a patterned amorphous carbon ($\alpha$-C) layer is formed on the substrate and exposes part of the substrate. Then, in a step 130, a first $\alpha$-C layer covering the patterned $\alpha$-C layer and part of the substrate is formed. Afterward, in a step 140, part of the substrate and part of the first $\alpha$-C layer covering part of the substrate are removed for forming a patterned substrate and a second $\alpha$-C layer. Thereon, in a step 150, the patterned $\alpha$-C layer and the second $\alpha$-C layer are removed.

Depending on the chosen substrate, following manufacturing processes are performed on the patterned substrate to form an electronic device. The above-described steps are illustrated more specifically as follow with reference to the accompanying drawings.

Please referring to FIGS. 2A~2F, cross-sectional views of the fabrication method of an electronic device according to the preferred embodiment of the present invention are illustrated in FIGS. 2A~2F.

Figure 2A:
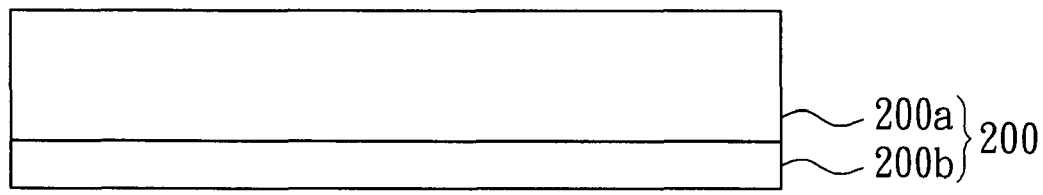
FIGS. 2A~2F are cross-sectional views of the fabrication method of an electronic device according to the preferred embodiment of the present invention.

As shown in FIG. 2A, the substrate 200 provided in the step 110 preferably includes a material layer 200a and a base 200b. The material layer 200a is disposed over the base 200b and preferably made of silicide, nitride, oxide or metal (such as aluminum or wolfram). In the fabrication method of the present invention, after the material layer 200a is etched to form the patterned substrate, the patterned substrate can be applied to an electronic device related with a polysilicon gate, shallow strength isolation (STI) technology, a contact hole of an oxide layer, a back-end-of-line (BEOL) process or a bit-line.

In the present embodiment, the step 120 further includes following sub-steps.

Figure 2B:
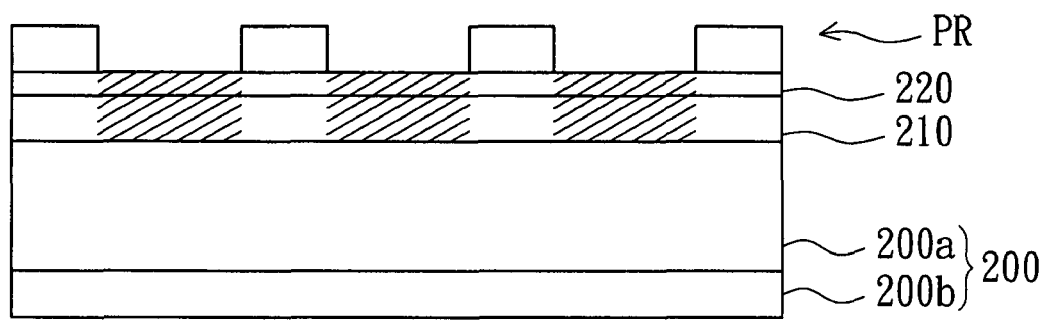

First, as shown in FIG. 2B, a $\alpha$-C layer 210, a dielectric anti-reflective coating (DARC) layer 220 and a patterned photoresist layer PR are formed on the substrate 200. The DARC layer 220 covers the $\alpha$-C layer 210. The patterned photoresist layer PR is positioned over the DARC layer 220.

The $\alpha$-C layer 210 is a graphite type of film with a C=C double bond, which enables stable film properties. The thickness of the $\alpha$-C layer 210 can be tuned from several hundred to five thousand angstroms to maximize etching selectivity correspondingly. And the $\alpha$-C layer 210 can be easily removed by oxygen plasma etch. The $\alpha$-C layer 210 is made of gas mixture including carbon hydrogen compound (such as $CH_4$, $C_2H_2$, $C_3H_6$, $C_3H_4$, $C_4H_8$ or $C_4H_{10}$) and inert gas (such as He or Ar). Deposition rate (for example, 100~1000 A/min) can be provided by using chemical vapor deposition (CVD) process with proper parameters. Also, the carbon-hydrogen ratio of the α-C layer 210 can be controlled to adjust the optical properties and the etch selectivity. For example, the ratio of hydrogen is reduced to increase the refractive index (n) or the light absorption coefficient (k) of the α-C layer 210. The etch resistance of the α-C layer 210 is increased as well. Generally, hydrogen in the carbon-hydrogen ratio is substantially between 10% and 60%.

Therefore, the α-C layer 210 and the DARC layer 220 provide high selectivity and low reflectivity (less than 0.5%). A photolithographic machine with 248 um DUV can be used to transfer the pattern, and the thickness of the patterned photoresist layer PR is only about 100 nm (a quarter of the conventional photoresist layer).

Figure 2C:
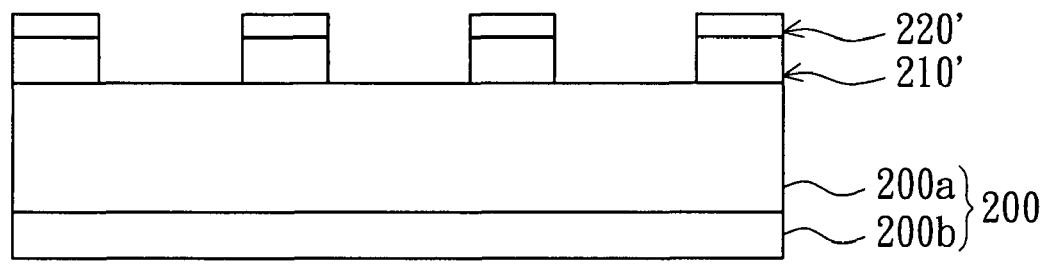

Next, as shown in FIG. 2C, part of the DARC layer 220 and part of the α-C layer 210 (the shadow part in FIG. 2B) are removed to form a patterned DARC layer 220' and a patterned α-C layer 210'. Meanwhile, the patterned photoresist layer PR is removed. In the present embodiment, the above removing steps are performed via plasma $O_2$ etching. For example, ozone, oxygen or chlorine is used to perform an ash process. Furthermore, the photoresist layer is usually made of carbon hydrogen compound, so the patterned photoresist layer PR can be removed at the same time. Side product or solid residual is evaporated into gas more easily via the plasma $O_2$ etching step. As a result, the side product or the solid residual can be removed from the reaction chamber by a pump. Therefore, the side product or the solid residual is removed automatically. Further, a subsequently cleaning process by dry and wet strip can be performed.

Figure 2D:
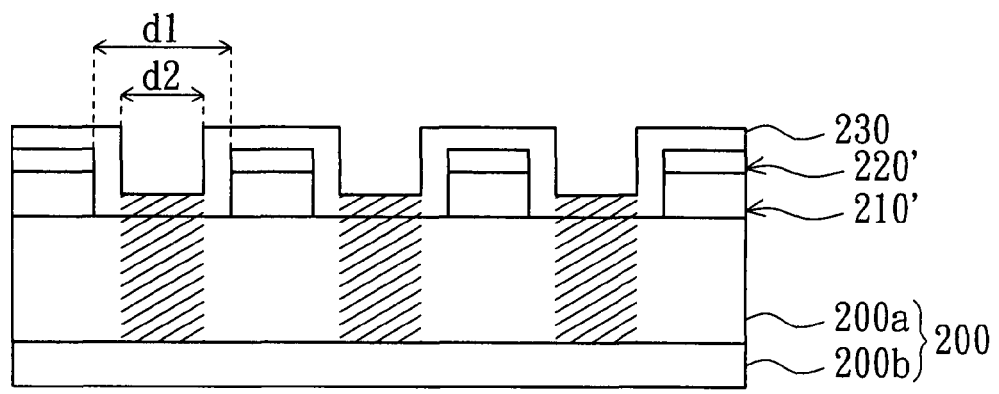

As shown in FIG. 2D, after the patterned DARC layer 220' and the patterned α-C layer 210' are formed, in the step 130, another amorphous carbon layer (that is, the first α-C layer 230) is formed to cover the patterned DARC layer 220', the patterned α-C layer 210' and part of the substrate 220 (shadow part in FIG. 2D) exposed by the patterned α-C layer 210'. For example, the deposition method of the first α-C layer 230 is the same as that of the α-C layer 210. The carbon-hydrogen ratio can be the same or different. In the present embodiment, the same carbon-hydrogen ratio is used, so that the first α-C layer 230 shields the patterned α-C layer 210' more effectively.

Moreover, the first α-C layer 230 is formed to cover the patterned α-C layer 210', which means a hard mask with a smaller pitch is re-defined. As shown in FIG. 2D, the pitch d1 is defined by the patterned photoresist layer PR. A smaller pitch d2 (required pitch) is obtained by controlling the deposition thickness of the first α-C layer 230 properly.

Figure 2E:
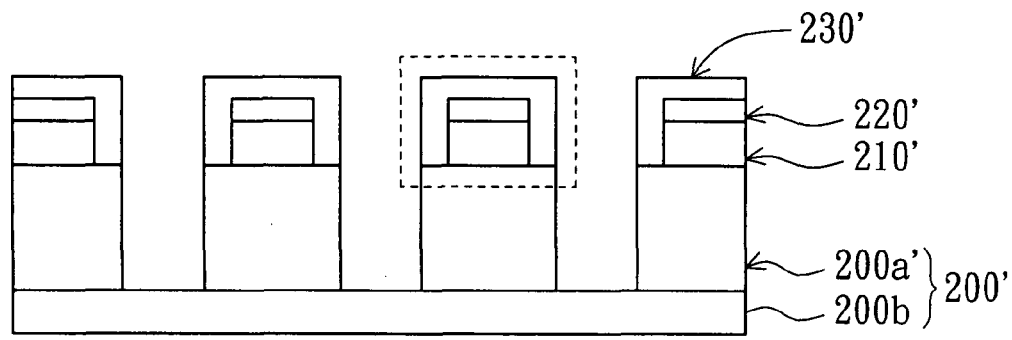

As shown in FIG. 2E, in the step 140, part of the substrate 200 and part of the first α-C layer 230 covering part of the substrate 200 are removed to form the patterned substrate 200' and a second α-C layer 230'. As stated above, after the required pitch is achieved through the first α-C layer 230, part of the first α-C layer 230 (within the shadow part in FIG. 2D) is removed via plasma $O_2$ etching to expose part of the material layer 200a of the substrate 200. Later, depending on the material of the material layer 200a, a suitable etching step is performed to remove part of the material layer 200a for forming an etched material layer 200a'. The patterned DARC layer 220' is preferably also removed in the step 140.

Figure 2F:
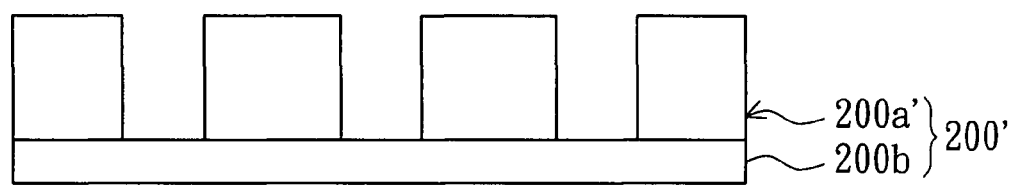

Afterward, as shown in FIG. 2F, in the step 150, other films except the patterned substrate 200' (such the patterned α-C layer 210', the second α-C layer 230' or the patterned DARC layer 220') are removed via plasma $O_2$ etching, further, subsequently cleaning by dry and wet strip can be conducted. As a result, a patterned substrate 200' with the required pattern pitch is formed completely. In the present embodiment, for example, several contact holes are formed in the patterned substrate 200'.

However, anyone who has ordinary skill in the field of the present invention can understand that the invention is not limited thereto. For example, although the pattered α-C layer formed in the step 120 is illustrated as one α-C layer in FIGS. 2B and 2C, the patterned α-C layer can be formed by several α-C layers. Furthermore, the optical properties of each α-C layer can be designed respectively to eliminate or absorb the reflected or transmitted light at the interface for improving the pattern transfer quality.

Moreover, the second α-C layer and the patterned α-C layer formed in the step 140 in FIG. 1 can be functioned as a new hard mask, and the method goes back to the step 120 to repeat the fabrication method of the present invention. In other words, the patterned α-C layer formed in the step 120 can include several α-C layers which are used for adjusting the pitch, as shown in the dotted area in FIG. 2E. As a result, the same effect can be achieved without the DARC layer. Or, a phase shifting layer is preferably formed on the α-C layer for decreasing the problems caused by diffraction. For example, the phase shifting layer is made by silicon oxynitride (SiON). Furthermore, except controlling the carbon-hydrogen ratio, nitrogen ($N_2$) can be added into the α-C layer in order to adjust the optical properties. The patterned photoresist layer can be trimmed through oxygen gas including chlorine.

The suitable materials for hard mask at least include Diamond-Like Carbon (DLC) and Amorphous Carbon Layer (ACL). Between these two carbon materials, amorphous carbon (α-C) layer mostly composed of $SP^2$ bonding shows better etching selectivity than DLC. The stability of the optical properties of the α-C layer is crucial for the process robustness of films and photolithography. More specifically, the refractive index and extinction coefficient are the critical properties of the α-C layer, which are important for reliable patterning. Exemplifyingly, in most cases, the refractive index of 1.20~1.60 and the extinction coefficient of 0.20~0.70 followed by 193-nm lithography are suitable to obtain minimum resist bottom reflectivity. Further, another important property of the α-C layer is the adhesion to polysilicon, which is particularly important in subsequent process, such as forming of the gate. Good α-C adhesion to polysilicon, larger than 40 $J/m^2$ for example, ensures a stable and correct patterning of the gate.

In the fabrication method of an electronic device according to the above embodiment, the amorphous carbon layer is deposited to form a hard mask with the required pitch. The advantages include high selectivity and low reflectivity. Also, a thinner photoresist layer and a photolithographic machine with 248 um DUV are able to be used for performing the microlithography process. The resolution and pattern pitch are the same as those obtained through a photolithographic machine with 193 um DUV. Besides, the photoresist layer and the mask are easily removed, so the manufacturing time and the cost are reduced. Moreover, the fabrication method of the present invention can be applied to relative electronic devices in all IC manufacturing processes.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fabrication method of an electronic device, the method comprising:
   (a) providing a substrate;
   (b) forming a plurality of blocks on the substrate, and each block comprising a patterned amorphous carbon (α-C) layer formed on the substrate and a patterned dielectric anti-reflective coating (DARC) layer formed on the patterned α-C layer, the blocks exposing part of the substrate;
   (c) forming a first α-C layer on the patterned DARC layer, for covering the patterned DARC layer, the patterned α-C layer and part of the substrate; and
   (d) removing part of the substrate and part of the first α-C layer covering part of the substrate for forming a patterned substrate and a second α-C layer, wherein the second α-C layer formed on the patterned substrate is positioned at least on a top surface and a lateral surface of each block comprising the patterned DARC layer and the patterned α-C layer.

2. The method according to claim 1, wherein the step (b) comprises:
   (b1) forming at least a α-C layer, a dielectric anti-reflective coating (DARC) layer and a patterned photoresist layer on the substrate, the DARC layer covering the α-C layer, the patterned photoresist layer positioned over the DARC layer;
   (b2) removing part of the DARC layer and part of the α-C layer for forming the patterned DARC layer and the patterned α-C layer; and
   (b3) removing the patterned photoresist layer.

3. The method according to claim 2, wherein in the step (b2), a plasma $O_2$ etching process is performed for removing part of the DARC layer and part of the α-C layer.

4. The method according to claim 3, wherein after the step (b2), the method further comprises:
   cleaning the patterned DARC layer and the patterned α-C layer by dry and wet strip.

5. The method according to claim 3, wherein the step (b2) and the step (b3) are performed at the same time.

6. The method according to claim 2, wherein in the step (c), the first α-C layer is formed in a manner of covering the patterned DARC layer.

7. The method according to claim 2, wherein the step (b1) comprises:
   trimming the patterned photoresist layer by using a trimming gas comprising oxygen and chlorine.

8. The method according to claim 1, wherein in the step (d), the first α-C layer is removed through a plasma $O_2$ etching process.

9. The method according to claim 8, wherein after the step (d), the method further comprises:
   cleaning the patterned substrate and the second α-C layer by dry and wet strip.

10. The method according to claim 1, wherein after the step (d), the method further comprises:
    (e) removing the patterned α-C layer and the second α-C layer.

11. The method according to claim 10, wherein in the step (e), the patterned α-C layer and the second α-C layer are removed through a plasma $O_2$ etching process.

12. The method according to claim 1, wherein the patterned α-C layer and the first α-C layer are formed in a manner of having the same carbon-hydrogen ratio or having different carbon-hydrogen ratios.

13. The method according to claim 1, wherein the patterned α-C layer and the first α-C layer are formed in a manner of having substantially 10% to 60% of hydrogen in the carbon-hydrogen ratio.

14. The method according to claim 1, wherein the substrate is provided by forming a material layer and a base, the material layer formed in a manner of covering the base and made of silicide, nitride, oxide or metal.

15. The method according to claim 1, wherein the step (b) comprises:
    forming a patterned phase shifting layer on the pattered α-C layer.

16. A fabrication method of a contact hole, the method comprising:
    (a) forming a patterned amorphous carbon (α-C) layer on a substrate by etching an α-C layer covering the substrate through a plasma $O_2$ etching process, the patterned α-C layer exposing part of the substrate;
    (b) forming a first α-C layer covering the patterned α-C layer and part of the substrate; and
    (c) removing part of the substrate and part of the first α-C layer through another plasma $O_2$ etching process for forming a patterned substrate and a second α-C layer, wherein the second α-C layer formed on the patterned substrate covers at least a top surface and a lateral surface of the patterned α-C layer.

17. The method according to claim 16, wherein in the step of removing part of the substrate and part of the first α-C layer, the substrate with the first α-C layer covering thereon is etched at a first selectivity greater than a second selectivity of etching the substrate without the first α-C layer.

18. The method according to claim 16, wherein the step (a) further comprises:
    (a1) forming at least the α-C layer, a dielectric anti-reflective coating (DARC) layer and a patterned photoresist layer on the substrate, the DARC layer covering the α-C layer, the patterned photoresist layer positioned over the DARC layer;
    (a2) etching part of the DARC layer and part of the α-C layer for forming a plurality of blocks on the substrate, and each block comprising a patterned DARC layer formed on the patterned α-C layer and the patterned α-C layer formed on the substrate through the plasma $O_2$ etching process, the blocks exposing part of the substrate; and
    (a3) removing the patterned photoresist layer.

19. The method according to claim 18, wherein the step (a1) comprises:
    trimming the patterned photoresist layer by using a trimming gas comprising oxygen and chlorine.

20. The method according to claim 16, wherein after the step (c), the method further comprises:
    (d) removing the patterned α-C layer and the second α-C layer.

21. The method according to claim 16, wherein the substrate is provided by forming a material layer and a base, the material layer formed in a manner of covering the base and made of oxide.

22. The method according to claim 16, wherein the step (b) comprises:
    forming a patterned phase shifting layer on the patterned α-C layer.

23. The method according to claim 1, wherein a width of a top surface of the second α-C layer is larger than a width of the top surface of each block, and equal to a width of a bottom surface of the patterned substrate.

24. The method according to claim 18, wherein the step (b) further comprises:
  forming the first α-C layer on the patterned DARC layer, for covering the patterned DARC layer, the patterned α-C layer and part of the substrate; and
  the step (c) further comprises:
    removing part of the substrate and part of the first α-C layer through another plasma $O_2$ etching process for forming the patterned substrate and the second α-C layer, wherein the second α-C layer formed on the patterned substrate covers at least a top surface and a lateral surface of each block comprising the patterned DARC layer and the patterned α-C layer.

\* \* \* \* \*